United States Patent [19]

Zimmer

[11] 4,107,760
[45] Aug. 15, 1978

[54] DUAL PRINTED CIRCUIT CARD MOUNT ASSEMBLY

[75] Inventor: Karl Joseph Zimmer, Berwyn, Pa.

[73] Assignee: Burroughs Corporation, Detroit, Mich.

[21] Appl. No.: 801,455

[22] Filed: May 31, 1977

[51] Int. Cl.$^2$ ............................................. H05K 7/20
[52] U.S. Cl. ..................................... 361/383; 361/412
[58] Field of Search ............... 361/386, 412, 413, 415, 361/383, 384

[56] References Cited

U.S. PATENT DOCUMENTS

| | | | |
|---|---|---|---|
| 2,945,989 | 7/1960 | Vogel et al. | 361/415 |
| 3,141,998 | 7/1964 | Silkman | 361/386 |
| 3,147,402 | 9/1964 | Hochstetler | 361/412 |
| 3,184,645 | 5/1965 | Schaeffer | 361/412 |
| 3,364,395 | 1/1968 | Donofrio et al. | 361/386 |

OTHER PUBLICATIONS

Jackson et al, "Heat Transfer Structure for Electronic Subassemblies", IBM Tech. Disc. Bull vol, 13, No. 12, May 71.

*Primary Examiner*—David Smith, Jr.
*Attorney, Agent, or Firm*—Francis A. Varallo; Edmund M. Chung; Kevin R. Peterson

[57] ABSTRACT

An assembly is described for providing an effective, yet comparatively inexpensive means of mounting a pair of high density printed circuit cards. The assembly provides maximum air passages between the card assemblies as well as over the outer surfaces thereof in applications where forced cooling air is provided. However, the assembly also finds particular application where the circuit cards are installed in a sealed air-tight electronic equipment housing and reliance must be had to conductive cooling.

6 Claims, 6 Drawing Figures

DUAL PRINTED CIRCUIT CARD MOUNT ASSEMBLY

CROSS REFERENCE TO RELATED APPLICATION

To the extent that patent application Ser. No. 536,975, now U.S. Pat. No. 3,991,346, filed Dec. 23, 1974 in the names of Gilbert R. Reid and Robert B. Snow and entitled "Reinforced Backplane for High Density Electrical Contacts" depicts the mounting of multi-layered printed circuit boards on both sides of a common metallic heat sink member, it is referenced herein. The reference patent and the present application are assigned to the same assignee.

BACKGROUND OF THE INVENTION

As described in the reference application, a present day method of packaging electronic equipment involves the mounting of electrical components, such as integrated circuit packages, on multi-layered printed circuit boards. These in turn are affixed to a metallic heat sink member, which is machined in an "H" section configuration having integral transverse top and base members. A large number of closely spaced holes are drilled or punched in the base member to accept respective bushings of insulative material containing metal blade-type contacts.

While the foregoing heat sink member design will perform satisfactorily in a variety of applications, it is extremely costly to manufacture because of its machine configuration. Moreover, it is difficult to properly register the large number of holes which must be drilled into its base section to accommodate the electrical contacts, the subsequent insertion of which is time consuming. The insertion force for this type of contact is also fairly high, necessitating the use of the reinforced backplane described and claimed in the reference patent.

The need exists for an economical dual card mount which uses a minimum number of simple components in its assembly, permits the use of low insertion force type connectors, is versatile in its acceptance of different types of electronic components having varied physical parameters, and at the same time provides more air passages for increased cooling efficiency. The dual card mount assembly of the present invention fulfills these requirements.

SUMMARY OF THE INVENTION

In accordance with the present invention, there is provided a card mount assembly comprised of a pair of parallel spaced-apart metallic back-up plates, each having a recessed portion to accommodate a printed circuit card which is preferably cemented or bonded thereto; a connector for receiving the pluralities of edge tabs of the respective circuit cards, which tabs are located at an extremity thereof; and a "T" shaped header section for joining a pair of analogous extremities of the back-up plates.

As compared with the reference heat sink card mount design, the substitution of a pair of stamped metal back-up plates for the single machined heat sink as comtemplated by the present invention, results in a substantial cost reduction. Moreover, the design provides more air for cooling, and air passages between the card assemblies as well as over the outside surfaces thereof. The recessed areas of one or both of the respective back-up plates may be arranged with respect to each other to accommodate high profile dual inline packages (DIP's) so as not to affect the overall space envelope allotted to the dual card mount. Variations in the metal back-up plate design are possible for different applications. A solid metal plate having a recess or cavity to receive a standard multi-layer card which is bonded therein by a thermally conductive, electrically insulating material may be used to advantage where forced air cooling is provided. On the other hand, where the cards are to be mounted in an air-tight enclosure, and heat dissipation is to be accomplished through conduction to the external housing, each of the back-up plates may be perforated in its recessed area to create a lattice structure to which the electrical components, such as "flat packs" may be mounted directly — connections to the circuit card being made through the openings in the plates. In the latter application, physical contact must be made between the card mount assemblies and the housing.

The connector to be used in the present design may be of the standard MIL approved type, which has a low insertion force. Use of such a connector eliminates both the need for pressing individual contacts into the heat sink frame as in the reference design, and the substantial insertion forces required by such contacts.

The final component of the present assembly is a simple header member, which serves to couple the pair of back-up plates to each other. In the aforementioned closed type system, it is this member which receives the heat from the plates and transfers it to the equipment housing or cover which, in turn, radiates it into the surrounding air space.

These and other features of the invention will become more fully apparent in the detailed description of the assembly which follows.

DESCRIPTION OF THE PREFERRED EMBODIMENT

Figures 1, 2, 6:
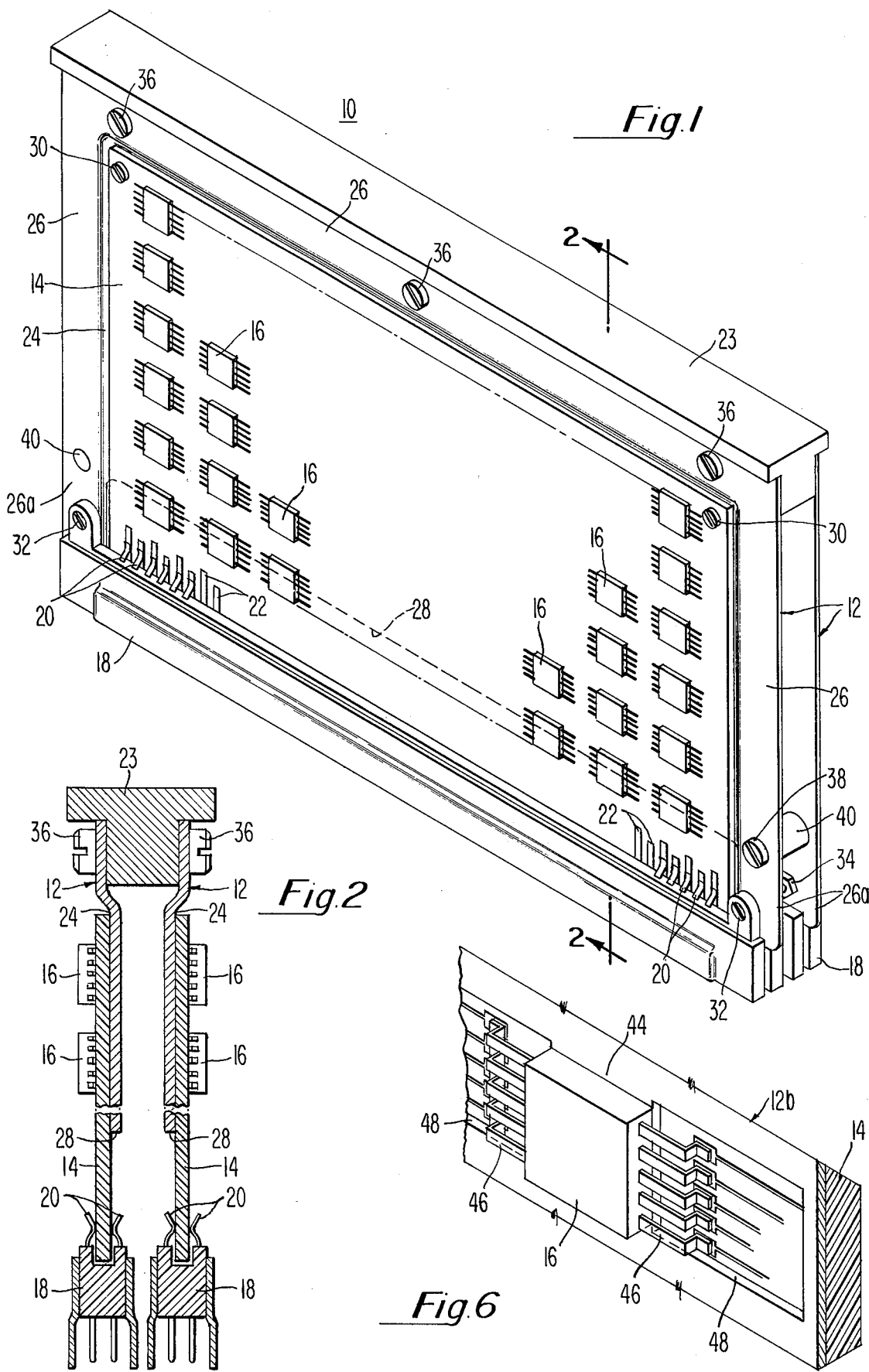
FIG. 1 is a pictorial view of the dual card mount assembly of the present invention.
FIG. 2 is a partial enlarged section view taken along the lines 2—2 of FIG. 1 and illustrating especially the relationship of the pair of circuit cards with their flat packs to the respective back-up plates.
FIG. 6 is an enlarged pictorial view of one of the flat packs illustrating its electrical connection to the circuit card via apertures in the lattice back-up plate.

FIG. 1 illustrates the dual printed circuit card assembly 10 of the present invention. The assembly is comprised of the following major components, namely, a pair of back-up plates 12 for mounting the respective printed circuit cards 14, the latter having flat packs 16 of electronic components connected thereto; a pair of connectors 18 having contacts 20 for receiving the edge tabs 22 of the respective circuit cards 14; and a "T"

shaped header member 23 for joining a pair of analogous extremities of the back-up plates 12.

With continued reference to FIG. 1 and additional reference to the section view of FIG. 2, the back-up plates 12 each have a recessed area or cavity 24 defined by an offset frame 26 on three sides thereof, for receiving a printed circuit card 14. A portion of each of the plates 12 adjacent the fourth side of the recessed area is cut away leaving an opening 28 flanked by the frame extensions 26a. Before the card 14 is mounted on the plate 12, a thermally conductive, electrically insulating coating (not shown) is applied to the surface of the recessed area 24 and allowed to dry. The same coating is then applied to the desired surface of the card 14 and the latter surface is immediately pressed against the plate recess 24. Additionally, the card 14 is secured with non-metallic screws 30 to the plate 12. One of the pair of connectors 18 is then positioned with respect to the base of the card containing the edge tabs 22 and the frame extensions 26a of the back-up plate 12. The card tabs 22 on both sides of the card are then in alignment with and physically contact the pre-tinned connector contacts 20. The connector 18 and back-up plate 12 are rigidly secured to each other by screws 32 which engage captive nuts 34. The connector contacts 20 are then readily soldered to the card tabs 22 by an infrared reflow process, thereby eliminating the tedious individual soldering of leads in the aforementioned reference design. This procedure completes a sub-assembly which represents one-half of the dual mount.

To complete the assembly, the foregoing operation is repeated in like manner, and the allochirally configured sub-assemblies are assembled in parallel spaced-apart relation and secured by screws 36 to the header member 23. Additionally, the plates 12 are secured to each other by shoulder screws 38 which engage spacer elements 40 attached respectively to the frame 26. The latter arrangement permits very small lateral adjustments in the distance between the two connectors 18 as they engage their mating connectors (not shown).

Thus far, the electronic components have been described as being comprised of flat packs 16 which are slab-shaped, very-low profile packages. In order to accommodate dual inline packages (DIP's) which have a substantially higher profile, and at the same time maintain a predetermined space envelope for the entire mount, the arrangement depicted in FIG. 3 is desirable.

With reference to the latter figure, the back-up plate 12a differs from plates 12 in that the frame offset is less and the corresponding recessed area 24a is more shallow. Moreover, plate 12a has been positioned so that its recessed area 24a (and circuit card 24 with its DIP's 42) faces inward toward plate 12. This is in contrast with the arrangement of FIG. 2, where both recessed areas 24 face outward. Since the distance between the respective rows of connector contacts 20 is substantially fixed during assembly, and the distance between the back-up plate edges which protrude beyond connectors 18 must remain constant (since these may serve as guides in a slotted housing), use of the shallow recess in plate 12a permits the circuit card 14 bearing the DIP's 42 to be in proper alignment with the associated connector contacts 20.

Figure 3:
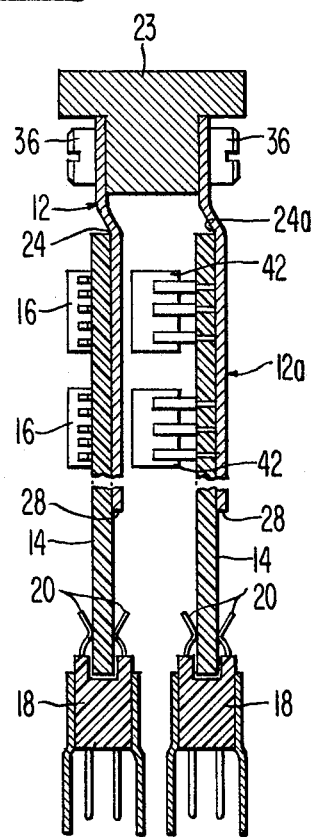
FIG. 3 is a view similar to that of FIG. 2 except that the physical dimensions and orientation of one of the back-up plates are altered to permit the assembly to accept high profile dual inline packages without changing the overall space envelope.

It should be noted that both plates in the assembly depicted in FIG. 3 may be of the same type as plate 12a and oriented such that the circuit cards 14 face each other in the space separating the plates. However, the DIP's 42 would have to be connected to the respective cards 14 in an interlaced pattern to prevent physical interference therebetween.

Figure 4:
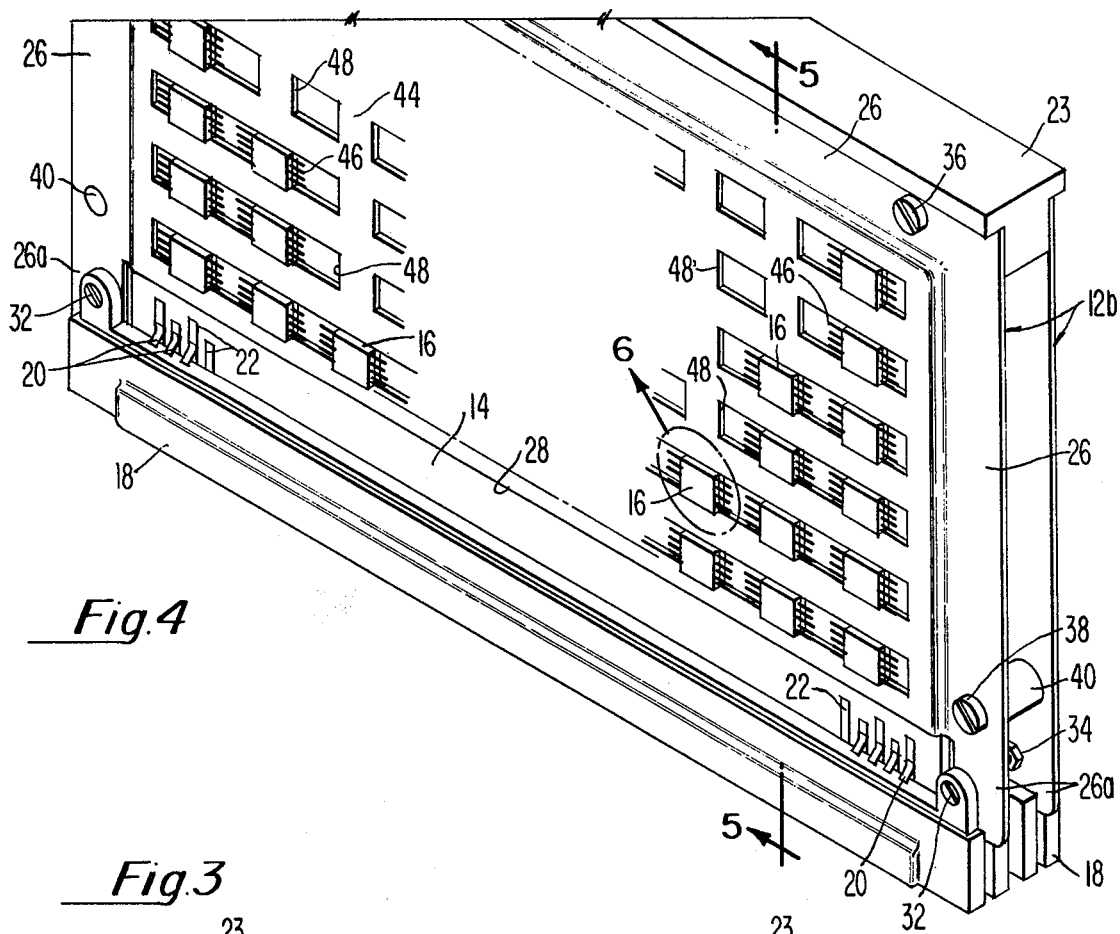
FIG. 4 is a partial pictorial view of an embodiment of the invention in which the recessed areas of the back-up plates have a lattice configuration.
Figure 5:
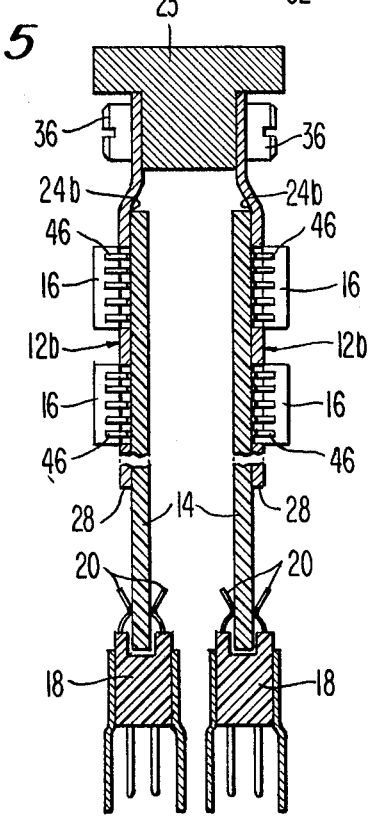
FIG. 5 is a section view taken along the lines 5—5 of FIG. 4 to better illustrate the relationship of the circuit cards and their components to the respective lattice back-up plates.

FIGS. 4 through 6 relate to an embodiment of the invention which finds particular application where the circuit cards are to be mounted in a sealed airtight enclosure and heat dissipation results from conducting heat from the dual mount assembly to the external housing. Like reference characters have been used to designate portions of the assembly identical to those depicted in FIGS. 1 through 3 and described hereinbefore. In FIG. 4, the recessed areas 24b of the back-up plates 12b are each illustrated as being perforated to create a lattice structure 44.

FIG. 5 depicts the plates 12b oriented side by side with their recessed areas 24b on the inside, facing each other. The circuit cards, 14 less the electronic flat packs, 16, are bonded or cemented in the respective recesses 24b as described in connection with FIG. 1. To achieve maximum heat transfer from the electronic components to the back-up plates, the undersides of the flat packs 16 are bonded with thermally conductive cement to the lattice 44 on the side thereof opposite to that of the cards.

As seen in greater detail in FIG. 6, electrical conductors 46 emanate from the flat pack edges substantially midway between the upper and lower surfaces thereof, and extend outward for a given distance in a plane parallel to these surfaces. The width of the lattice 44 is chosen to be approximately equal to or slightly less than the width of the flat pack 16 so that the conductors extend over the apertures 48 in the recessed areas 24b by said distance. At this point, the conductors 46 are bent toward the circuit cards 14 and via the apertures 48 their extremities contact the cards and are soldered thereto.

In the sealed configuration mentioned in connection with FIGS. 4 to 6, the header 23 which holds the latticed back-up plates 12b is adapted for mounting in close contact with the cover of the sealed housing (not shown). The cover may have fins to better radiate the heat. Accordingly, the mating surface of the header 23 and the pair of back-up plate frames 26 must be extremely flat and are generally treated with heat conducting substances to achieve maximum cooling via heat transfer over these joints.

Comparison of FIGS. 4 and 5 depicting latticed back-up plates 12b with FIGS. 1 and 2 illustrating solid plates 12, reveals that the two types of plates have been oppositely oriented. That is, in FIGS. 4 and 5, the recessed areas 24b are on the inside of the assembly 10, and in FIGS. 1 and 2, they face outward. It is to be noted that the latticed plates 12b may also be positioned as in FIG. 1, in which case, the circuit cards 14 would appear on the outside of the assembly, and the flat packs 16, in the space between the sub-assemblies. However, the arrangement in FIG. 4 is considered preferable because it allows greater access to the flat packs for servicing and testing.

Finally, as to the box contact connectors 18 employed in the dual card mount, these may be of the commercially available MIL specification type, each having, for example, 120 contacts on 0.10 inch centers. Such connectors may advantageously include polarizing key means (not shown) to prevent the inadvertent mismatching of the header and receptacle connector members. Such a feature assumes greater significance in a system package which may comprise thirty or forty circuit cards.

In conclusion, it is apparent that the dual card mount assembly disclosed herein offers a simple, economical and effective means of packaging high density electronic components. The inventive concepts and implementations described herein are directed to a specific application. In other applications, changes and modifications may be needed to suit particular requirements. Such variations as are within the skill of the designer, and which do not depart from the true scope and spirit of the invention are intended to be covered by the following claims.

What is claimed is:

1. An assembly for mounting dual printed circuit cards, each of which has a plurality of edge tabs, each of said cards having electronic components mounted on one side thereof, said assembly comprising:
   a pair of metallic back-up plates, each of said plates being generally planar but having a substantially rectangular recessed area defined by an offset frame on three sides thereof, the other side of each of said circuit cards being affixed to one of said plates within said recessed area, a portion of each of said plates adjacent the fourth side of said recessed area being cut away leaving only the respective extensions of said frame on opposite sides thereof, the edge tabs of each of said circuit cards being situated in said cut away portion of one of said plates;
   a pair of connectors each having a plurality of electrical contacts, said contacts engaging said edge tabs of one of said circuit cards, means for rigidly fastening each of said connectors to the frame extensions of one of said plates;
   a header member, means fastening the frame portions of both said plates situated opposite to said cut away areas to said header, and
   a pair of spacer elements affixed to the respective frames at opposite sides of said recessed areas and in proximity to said connector means, a pair of shoulder screws, said spacer elements being tapped to receive said screws, said frames having respective apertures in substantial alignment with said spacer elements whereby said screws engage said elements via said apertures for coupling said plates to each other in a parallel spaced-apart relationship, thereby completing said assembly, said assembly having a substantially unobstructed opening between said plates for air flow in a direction parallel to the longitudinal axes of said connectors, said spacer elements and shoulder screws permitting slight lateral movements of said pair of connectors with respect to each other to compensate for mounting tolerances.

2. An assembly, as defined in claim 1 wherein said pair of back-up plates are allochirally disposed with respect to each other.

3. An assembly as defined in claim 2 wherein said back-up plates are oriented such that the respective recessed areas face outward in opposite directions from each other.

4. An assembly, as defined in claim 1 further characterized in that one of said pair of back-up plates is configured to permit the use of high profile electronic component packages connected to the circuit card mounted in its recessed area, said last mentioned plate having a frame which is less offset and a recessed area which is more shallow than the other of said plates and being oriented in the same direction thereof, such that the packages are situated in the space between said plates and do not dimensionally affect the space envelope allotted to the assembly.

5. An assembly as defined in claim 4 wherein said high profile packages are of the dual inline type.

6. An assembly, as defined in claim 1, further characterized in that the edges of said plates protrude beyond the longitudinal extremities of said connectors, said plate edges serving as parallel spaced-apart guides to mount said assembly.

* * * * *